US007663115B2

(12) United States Patent
Korthout et al.

(10) Patent No.: US 7,663,115 B2
(45) Date of Patent: Feb. 16, 2010

(54) SEMICONDUCTOR DEVICE WITH A CMOS IMAGE SENSOR, APPARATUS COMPRISING SUCH A SEMICONDUCTOR DEVICE AND METHOD OF MANUFACTURING SUCH A DEVICE

(75) Inventors: Alouisius Wilhelmus Marinus Korthout, Drunen (NL); Daniel Wilhelmus Elisabeth Verbugt, Helden (NL); Adrianus Johannes Mierop, Eindhoven (NL); Willem Hendrik Maes, Lommel (BE)

(73) Assignee: DALSA Corporation, Waterloo (CA)

( * ) Notice: Subject to any disclaimer, the term of this patent is extended or adjusted under 35 U.S.C. 154(b) by 15 days.

(21) Appl. No.: 12/152,813

(22) Filed: May 16, 2008

(65) Prior Publication Data

US 2009/0283683 A1 Nov. 19, 2009

(51) Int. Cl.
  *H01L 27/146* (2006.01)
(52) U.S. Cl. .................. 250/370.09; 257/E21.001
(58) Field of Classification Search ............ 250/370.01, 250/370.08, 370.09, 370.11, 370.14; 378/98.8; 257/E27.127, E27.132, E27.133, E27.136, 257/E21.001
  See application file for complete search history.

(56) References Cited

U.S. PATENT DOCUMENTS 7,009,646 B1 * 3/2006 Fossum et al. .............. 348/294

7,462,807 B2 * 12/2008 Caupain et al. .......... 250/208.1

FOREIGN PATENT DOCUMENTS

| CA | 2 612 736 | 12/2007 |
| WO | WO2007/003495 | 1/2007 |

* cited by examiner

*Primary Examiner*—David P Porta
*Assistant Examiner*—Faye Boosalis
(74) *Attorney, Agent, or Firm*—Fisher Technology Law PLLC

(57) ABSTRACT

The invention relates to a semiconductor device with a semiconductor body comprising a CMOS image sensor with an active region having viewed in projection first sides and second sides perpendicular to the first sides said active region comprising a matrix of active pixels arranged in rows and columns, each pixel having a photosensitive region, the device further comprising a plurality of circuit elements for operating the pixel in the image forming process, the plurality of circuit elements comprising a first set of circuit elements for read-out of the columns and a second set of circuit elements for controlling the rows.

According to the invention a first part of the plurality of circuit elements is positioned outside the matrix along one of the first sides and a second part of the plurality of circuit elements is positioned within the matrix of active pixels remote from the second sides. Preferably the first part elements comprises the read-out circuitry of the columns and the second part elements comprises the control circuitry of the rows, the latter preferably being distributed over a number of centrally positioned columns. A device according to the present invention is very suitable for X-ray medical imaging.

20 Claims, 3 Drawing Sheets

SEMICONDUCTOR DEVICE WITH A CMOS IMAGE SENSOR, APPARATUS COMPRISING SUCH A SEMICONDUCTOR DEVICE AND METHOD OF MANUFACTURING SUCH A DEVICE

BACKGROUND OF THE INVENTION

The invention relates to a semiconductor device with a semiconductor body comprising a CMOS image sensor with an active region having viewed in projection first sides and second sides perpendicular to the first sides said active region comprising a matrix of active pixels arranged in rows and columns, each pixel having a photosensitive region, the device further comprising a plurality of circuit elements for operating the pixel in the image forming process, the plurality of circuit elements comprising a first set of circuit elements for read-out of the columns and a second set of circuit elements for controlling the rows. It is to be noted that in this application C-MOS image sensor means that the sensor is based on CMOS (=Complimentary Metal Oxide Semiconductor) technology or on NMOS technology or on PMOS technology. In CMOS technology both NMOS and PMOS technology is used. It is further noted that the photosensitive region normally contains an in-pixel amplifier circuit. Circuit elements for read-out of the columns comprise analog circuit elements for a bias, sample and hold function and digital circuit elements for an addressing function while circuit element for controlling the rows comprise digital circuit elements for a reset function and an addressing function. The circuit elements for read-out of the columns are also referred to as the horizontal read-out (circuitry) while the circuit elements for controlling the rows are also referred to as vertical driver (circuitry).

Such sensors have been in use for imaging transmission patterns from ionizing radiation, that without limitation are used in medical diagnostics. An image sensor to be used for X-ray imaging by a dentist forms an example.

Prior art, in particular PCT Patent Application WO 2007/003495 to ATMEL GRENOBLE that has been published on Jan. 11, 2007 uses CMOS image sensor having an octagonal, more precisely a chamfered rectangular semiconductor body. This is the traditional shape used for X-ray photography by a dentist and results in the largest ratio of image area versus final product outline. A plurality of circuit elements, in particular transistors, is present outside the active region, i.e. outside the matrix of rows and columns of active pixels comprising a photosensitive region. These circuit elements comprise the circuitry that performs among others the line/row selecting/addressing as well as the column selecting/addressing and these are often referred to as vertical driver and read-out circuitry respectively. In the chamfered prior art it is proposed to design all column circuitry below the middle section of the active region (along the short side of the pixel array), i.e. the lower part of the device between the two chamfered regions, in order to release space below the active region to position there the vertical driver circuitry or part thereof, these thus being positioned below the active region in the chamfered parts of the device. A disadvantage of this implementation is related to the layout asymmetry of the column read-out circuit for the different columns of the pixel array. This asymmetry may lead to visible effects in the image that might be difficult to correct by image data post-processing. Besides that the relative long wires connected with the column read-out lines of the columns underneath the chamfered edges are more prone to EMI (=Electro Magnetic Interference) issues that might introduce extra uncorrectable noise in the image.

The present inventors have recognized that these disadvantages can be overcome in a manner that implies additional advantages.

SUMMARY TO THE INVENTION

In consequence, amongst other things, it is an object of the present invention to provide a CMOS image sensor that is suitable for X-ray imaging e.g. such as used by a dentist that does not suffer from the above-mentioned drawbacks.

Now therefore, according to one of its aspects, the semiconductor device according to the invention is characterized in that a first part of the plurality of circuit elements is positioned outside the matrix along one of the first sides and a second part of the plurality of circuit elements is positioned within the matrix of active pixels remote from the second sides.

The invention is based on the following surprising recognitions. Firstly that by positioning a part of the relevant circuit elements in the form of the first set of circuit elements for addressing the columns outside the active region while another part of the relevant circuit elements is positioned within such a region, the problem of asymmetry of the circuitry is reduced or can even be completely avoided. Secondly, the inventors have realized that this can be done in a manner such that the loss of sensitivity of the sensor, more precisely the reduced column sensitivity, is optimized and that an unavoidable loss of said sensitivity can be corrected for by the use of adequate software like FCC (=Flat Field Correction) software. FCC algorithms are used for correcting video images by subtracting a 2D offset map and successively applying a 2D gain map to the video data.

Furthermore, the present invention is based on the surprising recognition that in a device according to the present invention the ratio between the area of the active region and the total device is increased and more close to one than in the prior art device which is an important advantage for among others dental intra-oral products. Finally, the present invention is based on the recognition that the present invention is also very favorable for use in non-chamfered square or rectangular semiconductor devices used in other X-ray medical applications. Such an application is a large area X-ray medical application in which a plurality of individual square/rectangular semiconductor bodies is used.

Although the present invention allows for using it with respect to the position of the horizontal read-out circuits of a CMOS image sensor, in a preferred embodiment it are the (complete) vertical drivers that are positioned within the active region while the (complete) horizontal read-out circuits remain—as in the prior art device—outside the active region. In a chamfered device however, the horizontal read-out circuits may now be present below the active region over the complete width of the device. Obviously this does not lead to layout asymmetry in the column read-out circuits. The same holds for the vertical drivers present within the active region.

Preferably, the second set of circuit elements, and thus the vertical drivers, is distributed over a number of columns of pixels. These columns are preferably present within a central part of the active region of the sensor. In a favorable modification the circuit elements of the second set of circuit elements, i.e. the elements of the vertical drivers, are present on both sides of and close to a border between two neighboring columns and in the same manner within a set of two neighboring further columns that are present next to the neighboring columns. In this way, no completely optical dead column is present, which is favorable for optimizing any correction for a locally reduced sensitivity.

Thus, in a further preferred embodiment the second part of circuit elements, preferably being the elements of the vertical drivers, is positioned within the photosensitive regions of the pixels circuit elements. However, preferably a part of each of the photosensitive regions in which the second part of circuit elements are positioned remains photosensitive.

Depending on the pixel dimensions, process technology and required vertical driver functionality, the size of the vertical driver layout might require the space of a couple of pixels. For larger pixels, the driver layout might even fit in the area of a single pixel. Depending on the size of the vertical driver layout with respect to the pixel area one may chose to distribute the driver over a number of pixels.

It is further noted that it is possible to use the present invention by having two (but preferably not more than two) dead columns located next to each other. It is noted also that the distribution of the second part of circuit elements over various columns can be done in different ways. Similar subsets of these elements can be distributed differently per row. E.g. elements of a first function in a first column and elements of a second function in a second column or elements of both the first and the second function may be distributed over different columns. In the latter case, these columns thus contain elements for both functions. In this way, it is furthermore also possible that for different columns different fractions of the pixel area are used for harboring vertical driver circuit elements.

For the application of the sensor device in X-ray in a dentist practice, the semiconductor sensor device preferably comprises a single semiconductor body having viewed in projection an octagonal shape, more precisely a chamfered rectangular shape.

In another important medical X-ray application, semiconductor device preferably comprises a plurality of semiconductor bodies each semiconductor body having viewed in projection a rectangular shape. In this way, larger parts of a human body, e.g. the lungs or the stomach can be investigated in direct way, i.e. with a ratio of the body part and the image thereof substantially being equal to one.

A preferred modification in this case is characterized in that the semiconductor bodies are positioned at close distance from one another and within two arrays, the first part of circuit elements being present along a free side of each semiconductor body. Such a 2×N matrix can contain e.g. 6 individual sensors of say 10×10 square centimeter. Thus, a part of a human body being e.g. 20×30 square cm can be imaged. The individual semiconductor bodies can be positioned as close to each other as about 20 micron. This corresponds roughly with a pixel width of 20 micron. Such a width (and height) for the pixels is relatively large compared to high pixel density sensors of today. However such sizes are very suitable for sensor devices according to the present invention and have the advantage that less sophisticated well developed (older) manufacturing technology can be used. Since in the present invention the vertical drivers are not present in the columns directly bordering the sides of the active regions, it is effectively possible that not more than one virtual dead column is present between two neighboring semiconductor bodies, which is quite acceptable. In fact, in practice two dead columns bordering each other are sometimes acceptable and in such a case distributing e.g. the vertical drivers elements completely over two neighboring columns is allowable. This since such columns are—according to the pre-sent invention—to be positioned in a more central part of the active region of the image sensor and thus will never border dead columns in a neighboring semiconductor body which would result in a number of neighboring dead columns larger than two.

In a favorable further modification, an M×N matrix of semiconductor bodies is envisaged. Each second array of such a matrix is positioned on a lower level than its neighbors and such that its read-out circuitry is below a neighboring array.

The invention also comprises an apparatus comprising a semiconductor device according to the present invention. Such an apparatus is very suitable for X-ray diagnostics in a medical environment. The apparatus further preferably comprises software by which a correction is performed for a reduction of sensitivity by the presence of the second part of the plurality of circuit elements present in the active region using a flat field correction algorithm.

A method of manufacturing a semiconductor device in which within a semiconductor body a CMOS image sensor is formed with an active region having first sides and second sides perpendicular to the first sides said active region being formed by forming a matrix of active pixels arranged in rows and columns, each pixel having a photosensitive region, the device further being formed by forming a plurality of circuit elements for operating the pixel in the image forming process, the plurality of circuit elements comprising a first set of circuit elements for read-out of the columns and a second set of circuit elements for controlling the rows, is according to the present invention characterized in that a first part of the plurality of circuit elements is formed outside the matrix along one of the first sides and a second part of the plurality of circuit elements is formed within the matrix of active pixels remote from the second sides. In this way, semiconductor image sensor devices according to the present invention are obtained.

In a preferred embodiment, for the first part of the plurality of circuit elements the first set of circuit elements for read-out of the columns is selected and for the second part of the plurality of circuit elements the second set of circuit elements for controlling the rows is selected. Preferably the elements of the second set of circuit elements are distributed over a number of columns of pixels, e.g. different columns in a central part of the sensor.

BRIEF DESCRIPTION OF THE DRAWING

These and further features, aspects and advantages of the invention will be discussed more in detail hereinafter with reference to the disclosure of a preferred embodiment of the invention, and in particular with reference to the appended Figures that illustrate.

DETAILED DESCRIPTION OF PREFERRED EMBODIMENTS

Figure 1:
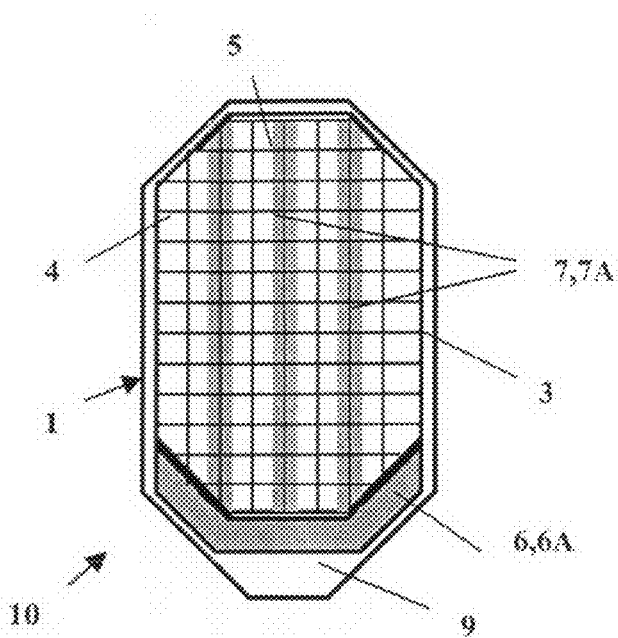
FIG. 1, a top view of a first embodiment of a semiconductor sensor device according to the present invention.

FIG. 1 shows—viewed in projection—a view of a first embodiment of a semiconductor sensor device 10 according to the present invention. De device 10 comprises a silicon semiconductor body 1 which is about 2 cm wide and about 3 cm high and contains chamfered edges, i.e. facets. As such the device 10 that contains a CMOS image sensor is very suitable for X-ray imaging in a dental practice. The sensor 10 has an active region 3 comprising a matrix of rows 4 and columns 5 of pixels containing a photosensitive region. The peripheral circuitry elements 6, 6A, i.e. essentially transistors more precisely MOS transistors, present below the active region 3 form the horizontal read-out circuits of the image sensor and comprise among others selecting/addressing transistors with the required wiring needed for selecting/addressing the columns in the image formation process.

According to the present invention, further circuit elements 7,7A that form the corresponding vertical drivers of the image sensor device 10 are present within the active region 3 and at a distance from the sides thereof. Thus, said elements 7,7A are present in a central part of the active region 3 of the sensor device 10. Moreover these elements 7,7A are distributed over a number of columns in said central region. In this example the elements 7,7A are positioned in a photosensitive region of each pixel of a first pair of two neighboring columns and close to the border between these columns. The elements 7,7A are positioned such that they merely occupy a smaller part of each pixel involved thus leading to a very limited reduction of the sensitivity of these pixels. This first pair of neighboring columns is here positioned substantially in the center of the active region 3. Further circuit elements 7,7A of the vertical drivers are positioned in a similar manner around the border between two further pairs of neighboring columns which pairs are pre-sent adjacent to the left and to the right of said first pair of columns.

Below the horizontal read-out circuits 6,6A there is a region 9 of the semiconductor body in which other peripheral circuitry is or can be integrated, such as among others the device timing generator, analog and digital signal processing and bond pads to make the electrical connection with the device functionality. Note that such elements are not shown in the drawing. This also holds for a carrier body on which the semiconductor body—or bodies—is attached as well as for the encapsulation of the device which is provided with a window above the active region of the sensor. The size of the sensor device 10 of this example is about 2×3 square cm, which roughly corresponds with the size of the semiconductor body 1 as shown in the drawing.

Figure 2:
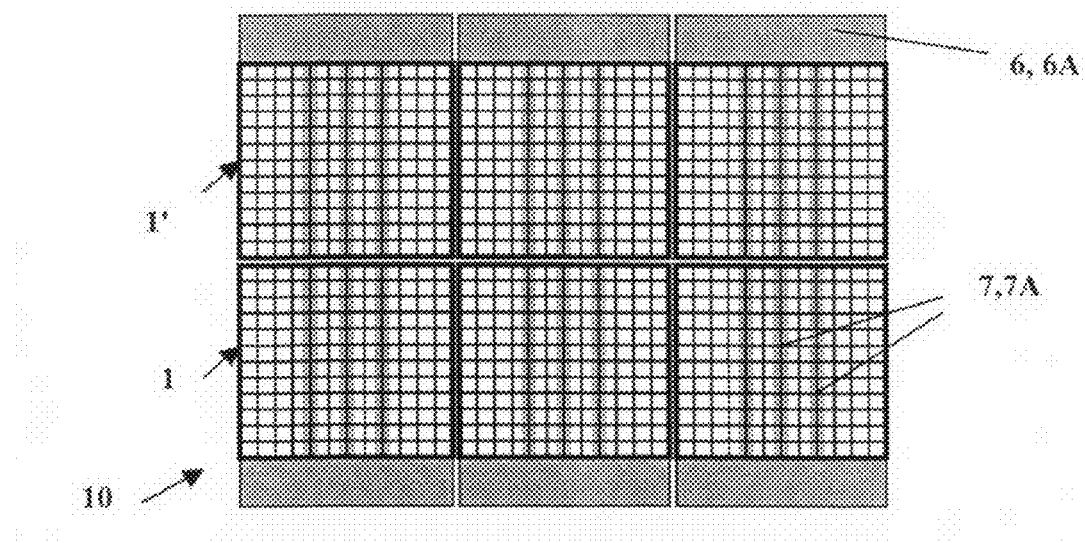
FIG. 2, a top view of a second embodiment of a semiconductor sensor device according to the present invention.
Figure 3:
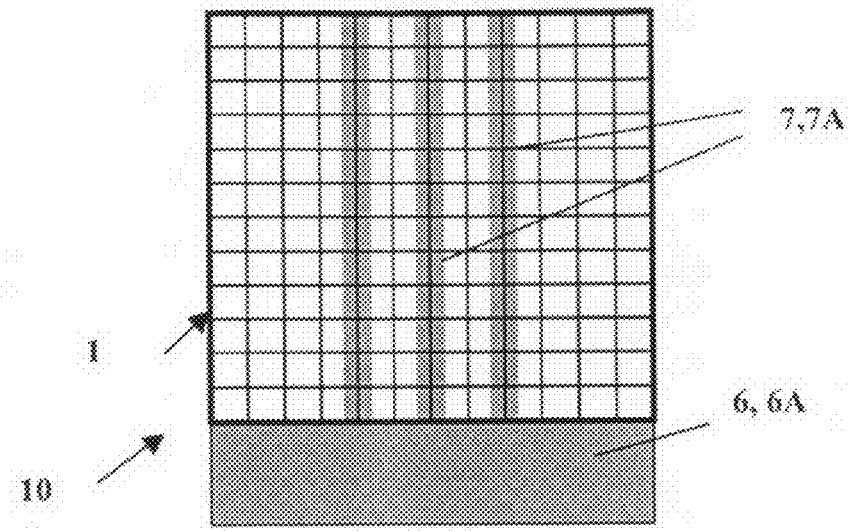
FIG. 3, a relevant part of the semiconductor sensor device of FIG. 2.

FIG. 2 shows—viewed in projection—a second embodiment of a semiconductor sensor device according to the present invention. The sensor device 10 of this example that is equivalent to an assembly of multiple semiconductor devices according to the present invention, is particular suitable for large area X-ray medical diagnostic applications. The total device 10 measures e.g. about 20×30 square cm. And comprises semiconductor bodies 1,1' in two arrays of each three semiconductor bodies 1,1'. Each semiconductor body 1,1'— as also shown separately in FIG. 3—corresponds roughly with the size of a full sensor production wafer, e.g. a 6 to 12 inch wafer. The technology involved is related to the size of each pixel present at the crossing of rows 4 and columns 5, which is in this example about 50×50 square micron. Within individual semiconductor bodies 1,1' the horizontal read-out circuit elements 6 are positioned outside the active region just as in the previous example while again the vertical driver circuit elements 7,7A are distributed over a number of columns 5 in a central part of the device 10. In this example again on both sides of and close to the borders between three subsequent pairs of columns 5. Since the horizontal read-out circuits 6 are positioned on the free side of the array of semiconductor bodies 1,1' the active region is formed by six individual active regions that on all sides that face another active region are positioned so close to each other that a "dead" region between the individual semiconductor bodies 1,1' is not wider than about the width of an individual pixel and thus no more than one virtual dead row 4 or dead column 5 is present between two neighboring semiconductor bodies 1,1'.

Further details—apart from the size and the geometry—may be similar to those discussed above for the sensor of the first example. In a favorable further embodiment, an M×N matrix of semiconductor bodies, e.g. a 3×3 matrix is present. In this embodiment a further array of semiconductor bodies is positioned at a lower level than its two neighboring arrays of semiconductor bodies. For that purpose the carrier body may comprise a stepped surface. The relative position of the semiconductor bodies is viewed in projection such that the read-out circuits of an intermediate array of semiconductor bodies is positioned below one of the two neighboring arrays of semiconductor bodies. In this way a continuous active image area is possible corresponding with 3×3 of M×N individual active image areas.

Figure 4:
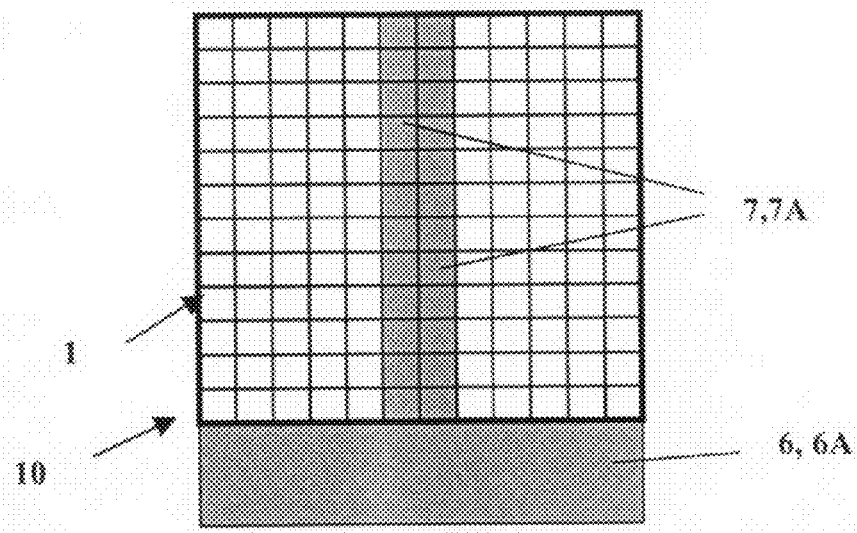
FIG. 4, an alternative part of the semiconductor sensor device of FIG. 2.

FIG. 4 shows an alternative semiconductor body 1 which may be used in the sensor array of the second example as shown in FIG. 2. In this modification the horizontal read-out elements 6 are positioned as in FIGS. 2 and 3 but the vertical driver elements 7,7A are only distributed over a central pair of columns which they occupy completely. Effectively this means that there are two dead columns in the center of the active region of the semiconductor body 1 of this modification, which is still acceptable.

Figure 5:
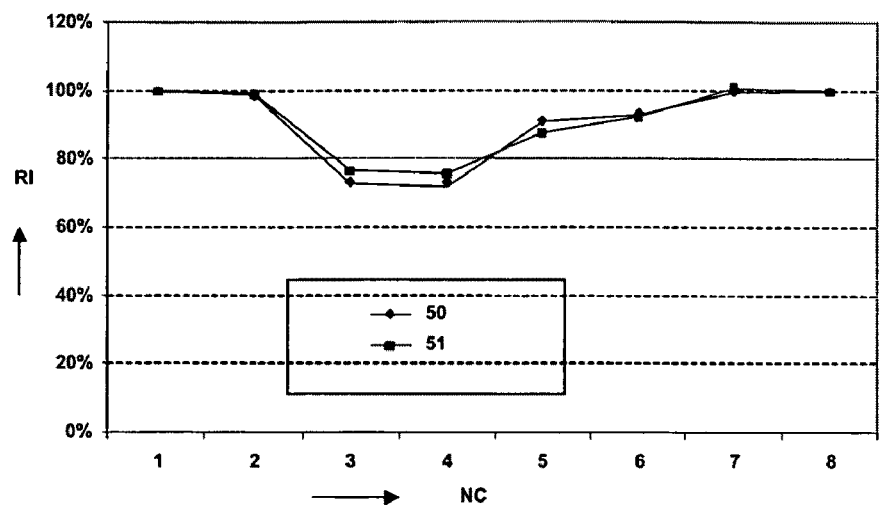
FIG. 5, the relative column sensitivity of a semiconductor sensor device according to the invention as a function of the column position, and FIG. 6, the relative column dark signal of a semiconductor sensor device according to the invention as a function of the column position.

FIG. 5 shows the relative column sensitivity (RI) of a semiconductor sensor device according to the invention as a function of the column position (NC). The structure of the device is as FIG. 3. Line 50 containing the diamonds represents the expected pixel output while line 51 with the squares represent the measure pixel output of a semiconductor image sensor device according to the present invention. Columns 1 and 8 are reference bulk columns while the columns 2-7 are involved in the distribution of the vertical driver elements. The figure shows that there is a good agreement between the expected and measured results. Furthermore local reductions in sensitivity are such that correction by suitable software is possible. The asymmetry and gradual changes in the sensitivity of the relevant columns can be explained by the way the vertical driver elements were distributed in this example over the columns in question.

Figure 6:
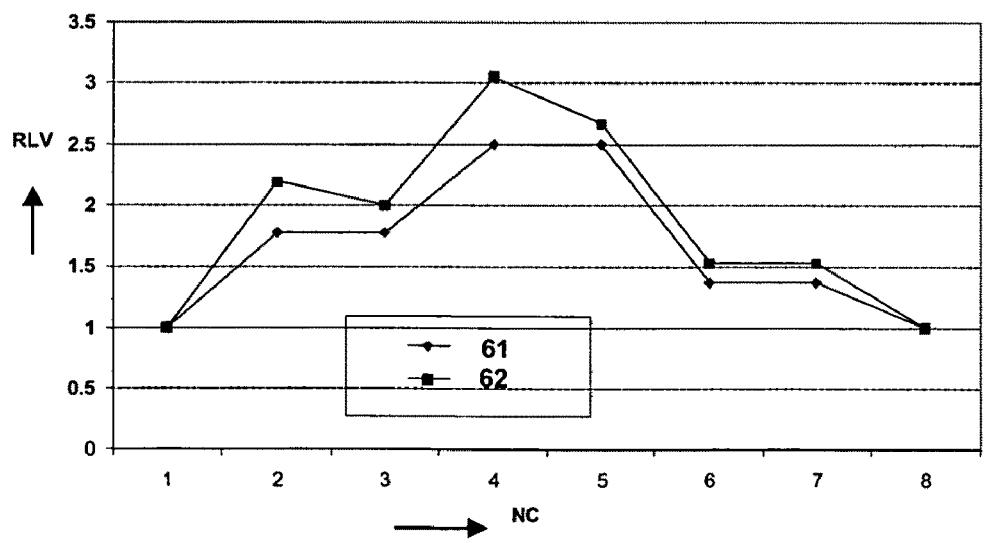

FIG. 6 shows the relative column dark signal, i.e. the relative leakage voltage (RVI) that is a measure for the off set, of a semiconductor sensor device according to the invention as a function of the column position (NC). Again line 61 with the diamonds again shows the expected leakage voltage while line 62 with the squares shows the measured results. Again a reasonable agreement between expected and measured results can be observed.

Now, the present invention has hereabove been disclosed with reference to preferred embodiments thereof. Persons skilled in the art will recognize that numerous modifications and changes may be made thereto without exceeding the scope of the appended Claims. In consequence, the embodiments should be considered as being illustrative, and no restriction should be construed from those embodiments, other than as have been recited in the Claims.

The invention claimed is:

1. A semiconductor device with a semiconductor body comprising a CMOS image sensor with an active region having viewed in projection first sides and second sides perpendicular to the first sides said active region comprising a matrix of active pixels arranged in rows and columns, each pixel having a photosensitive region, the device further comprising a plurality of circuit elements for operating the pixel in the image forming process, the plurality of circuit elements comprising a first set of circuit elements for read-out of the columns and a second set of circuit elements for controlling the rows, said device being characterized in that a first part of the plurality of circuit elements is positioned outside the matrix along one of the first sides and a second part of the plurality of circuit elements is positioned within the matrix of active pixels remote from the second sides, wherein the second part of circuit elements is positioned within the photosensitive regions of the pixels and wherein a part of each of the photosensitive regions in which the second part of circuit elements are positioned remains photosensitive.

2. A semiconductor device as claimed in claim 1, wherein the first part of the plurality of circuit elements is the first set of circuit elements for read-out of the columns and the second part of the plurality of circuit elements is the second set of circuit elements for controlling the rows.

3. A semiconductor device as claimed in claim 2, wherein the second set of circuit elements is distributed over a number of columns of pixels.

4. A semiconductor device as claimed in claim 3, wherein the columns of pixels over which the second set of circuit elements is distributed are within a central part of the active region of the sensor.

5. A semiconductor device as claimed in claim 3, wherein the second set of circuit elements are present on both sides of and close to a border between two neighboring columns and in the same manner within a set of two neighboring further columns that are present next to the neighboring columns.

6. A semiconductor device as claimed in claim 1, wherein the semiconductor device comprises a single semiconductor body having viewed in projection an octagonal shape.

7. A semiconductor device as claimed in claim 1, wherein the semiconductor device comprises a plurality of semiconductor bodies each semiconductor body having viewed in projection a rectangular shape.

8. A semiconductor device as claimed in claim 7, wherein the semiconductor bodies are positioned at close distance from one another and in two arrays, the first part of circuit elements being present along a free side of the arrays.

9. A semiconductor device as claimed in claim 8, wherein a further array of semiconductor bodies is present between the two arrays of semiconductor wherein the further array is viewed in projection positioned on a lower level than the two arrays and the circuitry outside the active region of the semiconductor bodies of the further array is positioned below the semiconductor bodies of one of the two arrays.

10. A semiconductor device as claimed in claim 1, wherein the image sensor is suitable for X-ray medical applications.

11. An apparatus comprising a semiconductor device as claimed in claim 1.

12. A method of manufacturing a semiconductor device in which within a semiconductor body a CMOS image sensor is formed with an active region having first sides and second sides perpendicular to the first sides said active region being formed by forming a matrix of active pixels arranged in rows and columns, each pixel having a photosensitive region, the device further being formed by forming a plurality of circuit elements for operating the pixel in the image forming process, the plurality of circuit elements comprising a first set of circuit elements for read-out of the columns and a second set of circuit elements for controlling the rows, said method being characterized in that a first part of the plurality of circuit elements is formed outside the matrix along one of the first sides and a second part of the plurality of circuit elements is formed within the matrix of active pixels remote from the second sides, wherein the second part of circuit elements is positioned within the photosensitive regions of the pixels and wherein a part of each of the photosensitive regions in which the second part of circuit elements are positioned remains photosensitive.

13. A method as claimed in claim 12, wherein for the first part of the plurality of circuit elements the first set of circuit elements for read-out of the columns is selected and for the second part of the plurality of circuit elements the second set of circuit elements for controlling the rows is selected.

14. A method as claimed in claim 13, wherein the second set of circuit elements is distributed over a number of columns of pixels.

15. A semiconductor device comprised of a semiconductor body, the semiconductor body being comprised of a CMOS image sensor, the CMOS image sensor comprising an active region and a plurality of circuit elements for operating an image forming process, wherein:
   the active region is characterized by a first side and a second side perpendicular to the first side;
   the active region comprises a matrix of active pixels arranged in rows and columns, each active pixel including a photosensitive region;
   the plurality of circuit elements comprises a first set of circuit elements for read-out of the columns and a second set of circuit elements for controlling the rows;
   a first part of the plurality of circuit elements comprises one of the first and second sets of circuit elements;
   a second part of the plurality of circuit elements comprises the other of the first and second sets of circuit elements;
   the first part of the plurality of circuit elements is positioned outside the matrix along the first side;
   the second part of the plurality of circuit elements is positioned within the photosensitive regions of the active pixels remote from the second side so that a portion of each of the photosensitive regions in which the second part of the plurality of circuit elements are positioned remains photosensitive.

16. A semiconductor device as claimed in claim 15, wherein the first part of the plurality of circuit elements is the first set of circuit elements for read-out of the columns and the second part of the plurality of circuit elements is the second set of circuit elements for controlling the rows.

17. A semiconductor device as claimed in claim 16, wherein the second set of circuit elements is distributed over a number of columns of pixels.

18. A semiconductor device as claimed in claim 15, wherein:
   the semiconductor device comprises plural additional semiconductor bodies;
   the semiconductor body and the plural additional semiconductor bodies are positioned at close distance from one another and in two arrays; and
   the first part of circuit elements are present along a free side of the arrays.

19. A semiconductor device as claimed in claim 15, wherein the image sensor is suitable for X-ray medical applications.

20. An apparatus comprising a semiconductor device according to claim 15.

* * * * *